United States Patent
Wang (10) Patent No.: US 9,142,653 B2
(45) Date of Patent: Sep. 22, 2015

(54) METHOD FOR MANUFACTURING THIN-FILM TRANSISTOR ARRAY SUBSTRATE

(71) Applicant: Shenzhen China Star Optoelectronics Technology Co., Ltd., Shenzhen, Guangdong (CN)

(72) Inventor: Jun Wang, Shenzhen (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 110 days.

(21) Appl. No.: 14/124,717

(22) PCT Filed: Oct. 17, 2013

(86) PCT No.: PCT/CN2013/085364
§ 371 (c)(1),
(2) Date: Dec. 8, 2013

(87) PCT Pub. No.: WO2015/043008
PCT Pub. Date: Apr. 2, 2015

(65) Prior Publication Data
US 2015/0221753 A1    Aug. 6, 2015

(30) Foreign Application Priority Data
Sep. 30, 2013   (CN) .......................... 2013 1 0462524

(51) Int. Cl.
*H01L 21/00*  (2006.01)
*H01L 29/66*  (2006.01)
*H01L 29/786* (2006.01)
*H01L 21/477* (2006.01)
(Continued)

(52) U.S. Cl.
CPC ...... *H01L 29/66969* (2013.01); *H01L 21/0226* (2013.01); *H01L 21/02164* (2013.01);
(Continued)

(58) Field of Classification Search
CPC ................. G02F 1/13458; G02F 2001/13472; G02F 2001/136236; H01L 27/1296
USPC ............................................ 438/164; 349/46
See application file for complete search history.

(56) References Cited

U.S. PATENT DOCUMENTS 8,431,452 B2 *  4/2013  Hou et al. ..................... 438/164
2009/0050884 A1  2/2009  Ye
(Continued)

FOREIGN PATENT DOCUMENTS

CN   101000896 A   7/2007
CN   101425543 A   5/2009
(Continued)

*Primary Examiner* — Caridad Everhart
(74) *Attorney, Agent, or Firm* — Andrew C. Cheng (57) ABSTRACT

The present invention provides a method for manufacturing a thin-film transistor (TFT) array substrate. The TFT array substrate is of a top-gate structure. The method for manufacturing a thin-film transistor array substrate applies three times of masking operation to manufacture the TFT array substrate, wherein IGZO is used to manufacture a TFT of the TFT array substrate so as to greatly increase the charging speed of the TFT with respect to a pixel electrode, improve the response speed of the pixel, and achieve a relatively high refresh rate. Further, the fast response also help improving row scanning rate of pixels to make it possible to achieve ultra-high definition of a TFT LCD. Further, the manufacturing method applies only three times of masking operation so as to significantly reduce the manufacturing steps, shortening the manufacturing time, effectively lowering down the manufacturing cost, and increasing throughput.

14 Claims, 6 Drawing Sheets (51) Int. Cl.
*H01L 21/4757* (2006.01)
*H01L 29/24* (2006.01)
*H01L 21/02* (2006.01)
*H01L 29/423* (2006.01)
*H01L 21/441* (2006.01)
*H01L 29/417* (2006.01)
*H01L 27/12* (2006.01)

(52) U.S. Cl.
CPC ........ *H01L21/02565* (2013.01); *H01L 21/441* (2013.01); *H01L 21/477* (2013.01); *H01L 21/47573* (2013.01); *H01L 27/127* (2013.01); *H01L 27/1262* (2013.01); *H01L 29/24* (2013.01); *H01L 29/41733* (2013.01); *H01L 29/42384* (2013.01); *H01L 29/7869* (2013.01)

(56) References Cited

U.S. PATENT DOCUMENTS

| | | | |
|---|---|---|---|
| 2010/0032668 A1* | 2/2010 | Yamazaki et al. | 257/43 |
| 2010/0283055 A1* | 11/2010 | Inoue et al. | 257/59 |
| 2011/0272696 A1* | 11/2011 | Ryu et al. | 257/59 |
| 2012/0094409 A1* | 4/2012 | Zhi et al. | 438/29 |
| 2012/0244659 A1* | 9/2012 | Imoto et al. | 438/104 |

FOREIGN PATENT DOCUMENTS

| | | |
|---|---|---|
| CN | 101577283 A | 11/2009 |
| CN | 102683423 A | 9/2012 |
| CN | 103123912 A | 5/2013 |

* cited by examiner

METHOD FOR MANUFACTURING THIN-FILM TRANSISTOR ARRAY SUBSTRATE

BACKGROUND OF THE INVENTION

1. Field of the Invention

The present invention relates to the field of manufacture of liquid crystal displays, and in particular to a method for manufacturing a thin-film transistor (TFT) array substrate with three masking operations.

2. the Related Arts

Nowadays, technology and science have been in prosperous development and progress and information devices are constantly innovated to suit the need of the public. The early displays were mostly cathode ray tube (CRT) displays, which is of a bulky size and a great power consumption and also generates radiations that are dangerous to human body for user operating for a long while. Thus, the displays that are currently available in the market are liquid crystal displays in substitution of the CRT displays.

Liquid crystal displays have a variety of advantages, such as thin device body, low power consumption, and being free of radiation, and are thus of wide applications. Most of the liquid crystal displays that are currently available in the market are backlighting liquid crystal displays, which comprise a liquid crystal panel and a backlight module. The operation principle of a liquid crystal panel is that liquid crystal molecules are interposed between two parallel glass substrates and a driving voltage is applied to the two glass substrates to control rotation direction of the liquid crystal molecules in order to refract out light emitting from the backlight module for generating images. Since the liquid crystal panel itself does not emit light, light must be provided from the backlight module in order to normally display images. Thus, the backlight module is one of the key components of a liquid crystal display.

The two parallel glass substrates of the liquid crystal panel are respectively a TFT array substrate and a color filter (CF) substrate. The TFT array substrate comprises: a substrate; gate lines, gate terminals, gate insulation layers, semiconductor active layers, data lines, source terminals, drain terminals, and protective layers formed on the data lines, source terminals, and drain terminals and pixel electrodes formed on the protective layers, wherein the gate terminals, the source terminals, the drain terminals, and the semiconductor active layers constitute thin-film transistors. In the state of the art, the TFT is an amorphous silicon thin-film transistor or a low temperature poly-silicon thin-film transistor. An amorphous silicon TFT display array requires only 3-5 photolithographic masking operations, and this leads to low cost and high competition power. A low temperature poly-silicon TFT display array usually needs 8-9 photolithographic masking operations, making the cost relatively high.

Oxide semiconductor IGZO (Indium Gallium Zinc Oxide) has a carrier mobility that is about 20-30 times of that of amorphous silicone and may greatly increase the charging/discharging speed of a TFT with respect to a pixel electrode thereby improving the response speed of the pixel electrode to achieve increased refreshing rate. Further, the increased response speed also increases, to quite a great extent, row scanning rate of pixels, making it possible to achieve ultra-high definition in a thin-film transistor liquid crystal display (TFT-LCD). Further, since the number of TFTs is reduced and light transmittal of the pixel is enhanced, the IGZO LCD shows high level of performance and increased efficiency. The oxide semiconductor IGZO can be manufactured with an existing amorphous silicon manufacturing line, with just minor modification. This makes it more competitive than low temperature poly-silicon in respect of cost.

However, the manufacture of a TFT with oxide semiconductor IGZO adopts a manufacturing process that requires 6 masking operations so that manufacturing efficiency is low and the manufacturing cost is high.

SUMMARY OF THE INVENTION

An object of the present invention is to provide a method for manufacturing a thin-film transistor (TFT) array substrate, which manufactures the TFT array substrate with three masking operations in order to greatly reduce the steps of the manufacturing process, shorting the manufacturing time, effectively lowering down the manufacturing cost, and improving throughput, wherein the TFT array substrate is manufactured by using an indium gallium zinc oxide so as to greatly increase the charging speed of the TFT with respect to a pixel electrode, to increase the response speed of the pixel electrode, and to achieve high refresh rate.

To achieve the object, the present invention provides a method for manufacturing a TFT array substrate, wherein the TFT array substrate is of a top-gate structure, the method for manufacturing a thin-film transistor comprising the following steps:

(1) providing a substrate;

(2) sequentially depositing and forming a buffer layer, an oxide semiconductor film, and a first metal layer on the substrate;

(3) forming a first photoresist layer on the first metal layer and patterning the first photoresist layer to form, at a predetermined location, a first photoresist pattern, which comprises a first portion and a second portion defining a ditch zone corresponding to the oxide semiconductor film, wherein the first photoresist pattern has a thickness in the second portion that is greater than that of the first portion;

(4) etching off parts of the first metal layer and the oxide semiconductor film that are located in areas not covered by the first photoresist pattern, removing the first portion of the first photoresist pattern to expose the first metal layer, etching off the first metal layer by using the second portion of the first photoresist pattern as a mask in order to expose the oxide semiconductor film, and peeling off the first photoresist pattern in order to form a source terminal and a drain terminal on the first metal layer; and (5) sequentially depositing an insulation layer and a second metal layer on the substrate and patterning the second metal layer to form a gate terminal.

The method for manufacturing a TFT array substrate further comprises:

a step (6) after step (5) for depositing a protective layer on the substrate, forming a second photoresist layer on the protective layer, and patterning the second photoresist layer to form, at a predetermined location, a second photoresist pattern, which comprises a third portion that is located at one side of the drain terminal and on a portion of the drain terminal and a fourth portion that is located at an opposite side of the drain terminal and on a portion of the drain terminal, wherein the third portion and the fourth portion of the second photoresist pattern define therebetween a recess;

a step (7) after step (6) for etching off a part of the protective layer that is not covered by the second photoresist pattern and a part of the insulation layer corresponding to the part of the protective layer in order to expose the drain terminal, thereby forming a contact hole, and removing the third portion of the second photoresist pattern; and a step (8) after step (7) for depositing a transparent conductive layer on the substrate and peeling and removing the fourth portion of the second photoresist pattern and the transparent conductive layer located thereon through photoresist peeling.

The method for manufacturing a TFT array substrate further comprises a step (9) after step (8) for subjecting the substrate to an annealing treatment to thus complete the manufacture of the TFT array substrate.

The substrate comprises a glass substrate; the buffer layer is formed of deposition of silicon dioxide; and the oxide semiconductor film comprises an indium gallium zinc oxide (IGZO) film.

In step (3), the first photoresist pattern is formed by being subjected operations of grey level, masking, exposing, and developing.

In step (4), a dry etch process is used to etch off the first metal layer with the second portion of the first photoresist pattern as a mask; and in step (4), peeling off the first photoresist pattern comprises an operation of peeling off the second portion of the first photoresist pattern.

In step (5), the insulation layer is formed by deposition of silicon dioxide; and in step (5), the second metal layer is subjected to operations of exposing, developing, etching, and photoresist peeling to form the gate terminal.

The etching comprises a wet etch process.

In step (6), the protective layer is formed by deposition of silicon dioxide or silicon nitride; and the second photoresist pattern is formed by being subjected to grey level, masking, exposing, developing.

In step (7), a dry etch process is used to etch off the part of the protective layer that is not covered by the second photoresist pattern and the part of the insulation layer corresponding to the part of the protective layer so as to form the contact hole.

The present invention further provides a method for manufacturing a thin-film transistor (TFT) array substrate, wherein the TFT array substrate is of a top-gate structure, the method for manufacturing a thin-film transistor comprising the following steps:

(1) providing a substrate;

(2) sequentially depositing and forming a buffer layer, an oxide semiconductor film, and a first metal layer on the substrate;

(3) forming a first photoresist layer on the first metal layer and patterning the first photoresist layer to form, at a predetermined location, a first photoresist pattern, which comprises a first portion and a second portion defining a ditch zone corresponding to the oxide semiconductor film, wherein the first photoresist pattern has a thickness in the second portion that is greater than that of the first portion;

(4) etching off parts of the first metal layer and the oxide semiconductor film that are located in areas not covered by the first photoresist pattern, removing the first portion of the first photoresist pattern to expose the first metal layer, etching off the first metal layer by using the second portion of the first photoresist pattern as a mask in order to expose the oxide semiconductor film, and peeling off the first photoresist pattern in order to form a source terminal and a drain terminal on the first metal layer; and (5) sequentially depositing an insulation layer and a second metal layer on the substrate and patterning the second metal layer to form a gate terminal;

and further comprising:

a step (6) after step (5) for depositing a protective layer on the substrate, forming a second photoresist layer on the protective layer, and patterning the second photoresist layer to form, at a predetermined location, a second photoresist pattern, which comprises a third portion that is located at one side of the drain terminal and on a portion of the drain terminal and a fourth portion that is located at an opposite side of the drain terminal and on a portion of the drain terminal, wherein the third portion and the fourth portion of the second photoresist pattern define therebetween a recess;

a step (7) after step (6) for etching off a part of the protective layer that is not covered by the second photoresist pattern and a part of the insulation layer corresponding to the part of the protective layer in order to expose the drain terminal, thereby forming a contact hole, and removing the third portion of the second photoresist pattern; and a step (8) after step (7) for depositing a transparent conductive layer on the substrate and peeling and removing the fourth portion of the second photoresist pattern and the transparent conductive layer located thereon through photoresist peeling;

and further comprising a step (9) after step (8) for subjecting the substrate to an annealing treatment to thus complete the manufacture of the TFT array substrate;

wherein the substrate comprises a glass substrate; the buffer layer is formed of deposition of silicon dioxide; and the oxide semiconductor film comprises an indium gallium zinc oxide (IGZO) film;

wherein in step (3), the first photoresist pattern is formed by being subjected operations of grey level, masking, exposing, and developing; and wherein in step (4), a dry etch process is used to etch off the first metal layer with the second portion of the first photoresist pattern as a mask; and in step (4), peeling off the first photoresist pattern comprises an operation of peeling off the second portion of the first photoresist pattern.

In step (5), the insulation layer is formed by deposition of silicon dioxide; and in step (5), the second metal layer is subjected to operations of exposing, developing, etching, and photoresist peeling to form the gate terminal.

The etching comprises a wet etch process.

In step (6), the protective layer is formed by deposition of silicon dioxide or silicon nitride; and the second photoresist pattern is formed by being subjected to grey level, masking, exposing, developing.

In step (7), a dry etch process is used to etch off the part of the protective layer that is not covered by the second photoresist pattern and the part of the insulation layer corresponding to the part of the protective layer so as to form the contact hole.

The efficacy of the present invention is that the present invention provides a method for manufacturing a thin-film transistor, wherein a TFT array substrate adopts a top-gate structure. The method for manufacturing a thin-film transistor applies three times of masking operation in manufacturing of the TFT array substrate, wherein IGZO is used to form a TFT of the TFT array substrate so as to greatly increase the charging speed of the TFT with respect to a pixel electrode, improve the response speed of the pixel, and achieve a relatively high refresh rate. Further, the fast response also help improving row scanning rate of pixels to make it possible to achieve ultra-high definition of a TFT LCD. Further, the manufacturing method applies only three times of masking operation so as to significantly reduce the manufacturing steps, shortening the manufacturing time, effectively lowering down the manufacturing cost, and increasing throughput.

For better understanding of the features and technical contents of the present invention, reference will be made to the following detailed description of the present invention and the attached drawings. However, the drawings are provided for the purposes of reference and illustration and are not intended to impose undue limitations to the present invention.

BRIEF DESCRIPTION OF THE DRAWINGS

The technical solution, as well as beneficial advantages, of the present invention will be apparent from the following detailed description of an embodiment of the present invention, with reference to the attached drawings. In the drawings.

DETAILED DESCRIPTION OF THE PREFERRED EMBODIMENTS

To further expound the technical solution adopted in the present invention and the advantages thereof, a detailed description is given to a preferred embodiment of the present invention and the attached drawings.

Referring to FIGS. 1-15, the present invention provides a method for manufacturing a thin-film transistor (TFT) array substrate. The TFT array substrate adopts a top-gate structure. The method applies only three times of masking operation so as to effectively lower down the manufacturing cost, improve the manufacturing efficiency, and increase throughput.

The method for manufacturing a thin-film transistor array substrate comprises the following steps:

Step 1: providing a substrate 21.

In the instant embodiment, the substrate 21 is a glass substrate, but is not limited thereto. Substrates made of other materials, such as plastics, can also be used.

Figure 1:
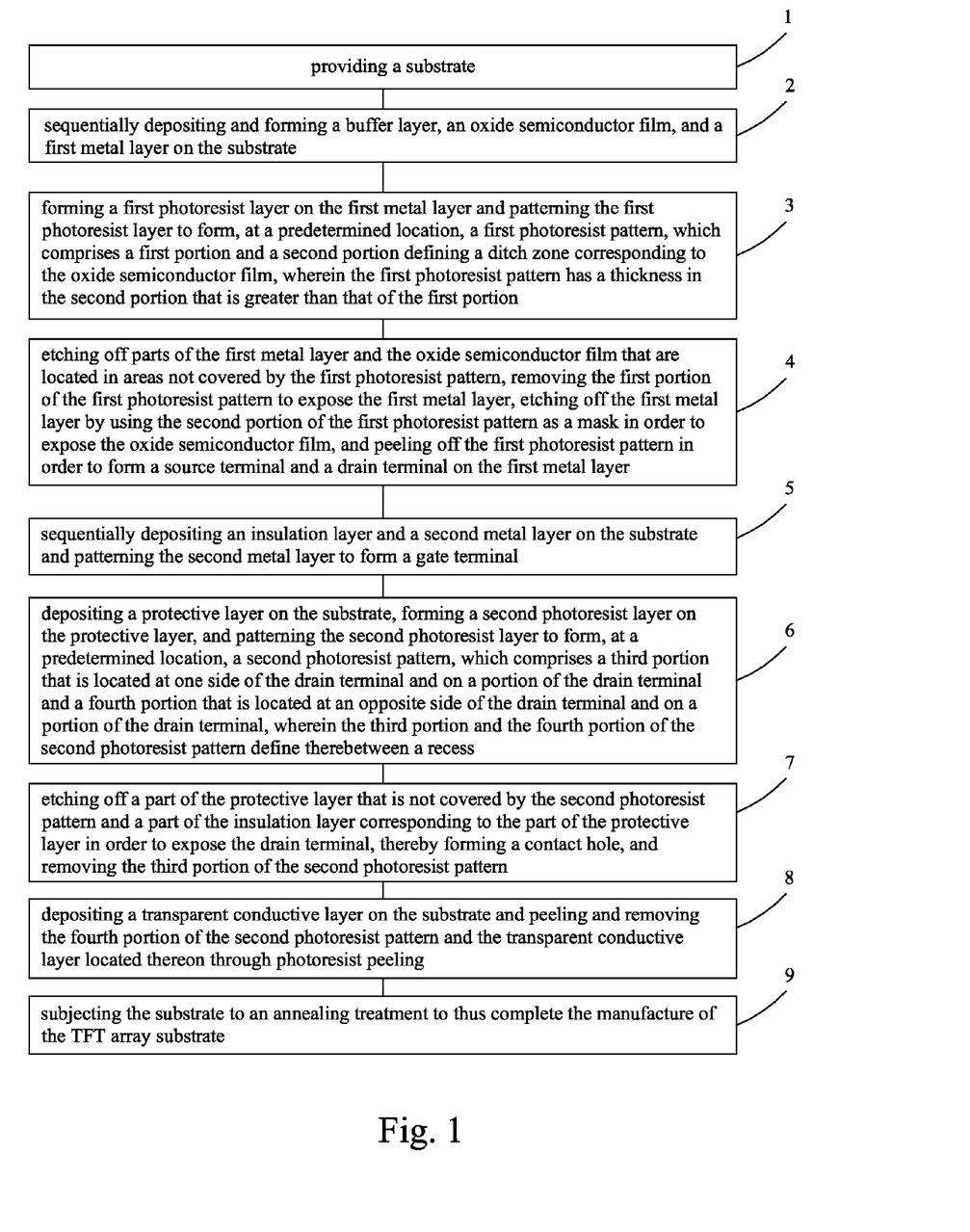
FIG. 1 is a flow chart illustrating a method for making a thin-film transistor (TFT) array substrate according to the present invention.
Figure 2:
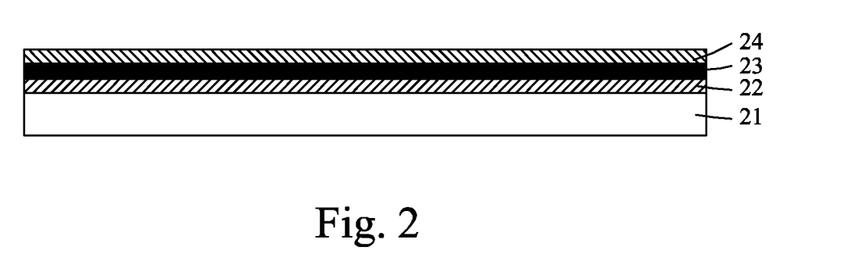
FIG. 2 is a schematic view showing the structure where a buffer layer, an indium gallium zinc oxide (IGZO) film, and a first metal layer have been formed on a substrate of the present invention.

Step 2: sequentially depositing and forming a buffer layer 22, an oxide semiconductor film 23, and a first metal layer 24 on the substrate 21.

As shown in FIG. 2, in the instant embodiment, the buffer layer 22 is formed by deposition of silicon dioxide depositing and the oxide semiconductor film 23 is an indium gallium zinc oxide (IGZO) film.

Figure 3:
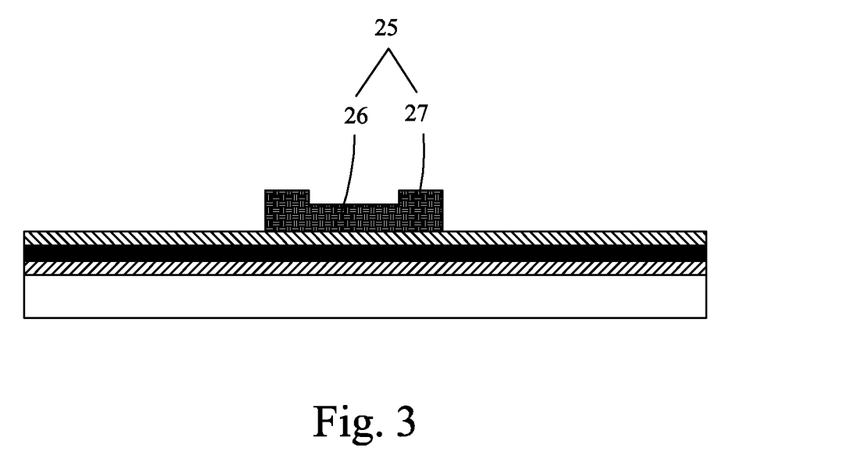
FIG. 3 is a schematic view showing the structure where a first photoresist layer has been formed on the substrate of the present invention.
Figure 4:
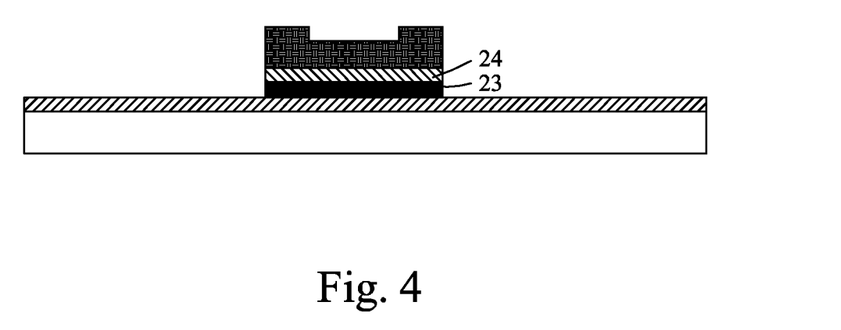
FIG. 4 is a schematic view showing the structure where the parts of the IGZO film and the first metal layer of the substrate of the present invention that are not covered by the first photoresist layer have been etched after being subjected to exposure.
Figure 5:
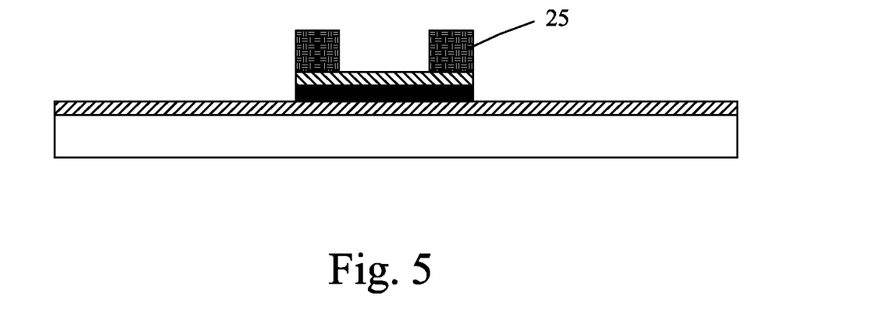
FIG. 5 is a schematic view showing the structure where a first photoresist layer of a first grey level exposure zone of the substrate of the present invention has been ashed.

Step 3: forming a first photoresist layer on the first metal layer 24 and patterning the first photoresist layer to form, at a predetermined location, a first photoresist pattern 25, which comprises a first portion 26 and a second portion 27 defining a ditch zone corresponding to the oxide semiconductor film 23, wherein the first photoresist pattern 25 has a thickness in the second portion 27 that is greater than that of the first portion 26.

As shown in FIG. 3, in Step 3, the first photoresist pattern 25 is formed by being subjected operations of grey level, masking, exposing, and developing and the first portion 26 of the first photoresist pattern 25 is formed by means of grey level exposure. In this step, the first masking operation of the three masking operations of the present invention is performed.

Step 4: etching off parts of the first metal layer 24 and the oxide semiconductor film 23 that are located in areas not covered by the first photoresist pattern 25, removing the first portion 26 of the first photoresist pattern 25 to expose the first metal layer 24, etching off the first metal layer 24 by using the second portion 27 of the first photoresist pattern 25 as a mask in order to expose the oxide semiconductor film 23, and peeling off the first photoresist pattern 25 in order to form a source terminal 27 and a drain terminal 28 on the first metal layer 24.

Figure 6:
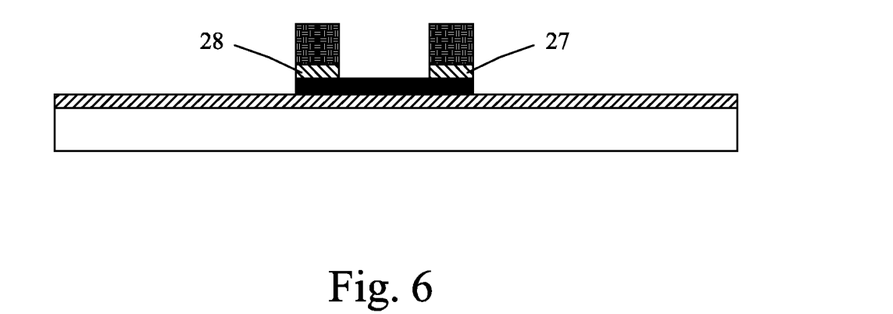
FIG. 6 is a schematic view showing the structure where a first metal layer of the first grey level exposure zone of the substrate of the present invention has been etched off.
Figure 7:
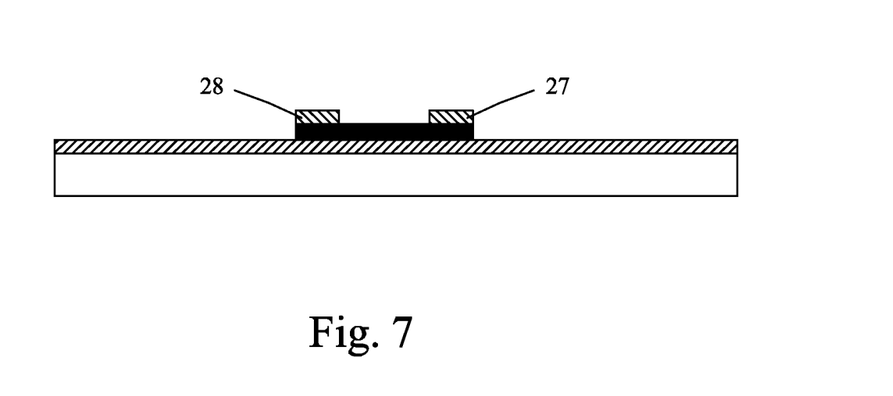
FIG. 7 is a schematic view showing the structure where the first photoresist layer of the substrate of the present invention has been peeled off.

In the step, a dry etch process is used to etch off the first metal layer 24 with the second portion 27 of the first photoresist pattern 25 as a mask, as shown in FIG. 6. The operation of peeling off the first photoresist pattern 25 is an operation to peel off the second portion 27 of the first photoresist pattern 25, as shown in FIG. 7.

Figure 8:
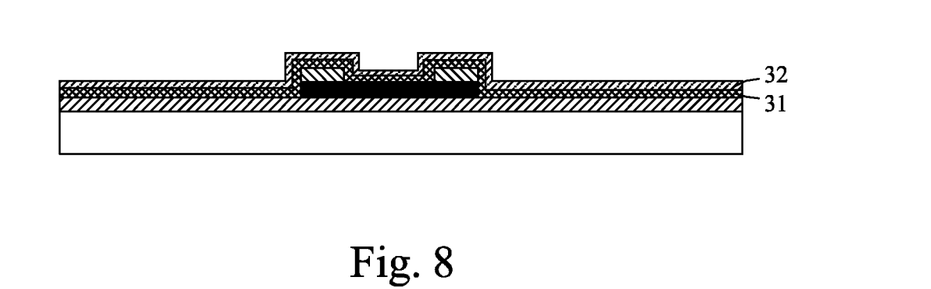
FIG. 8 is a schematic view showing the structure where a node point layer and a second metal layer have been deposited and formed on the substrate of the present invention.
Figure 9:
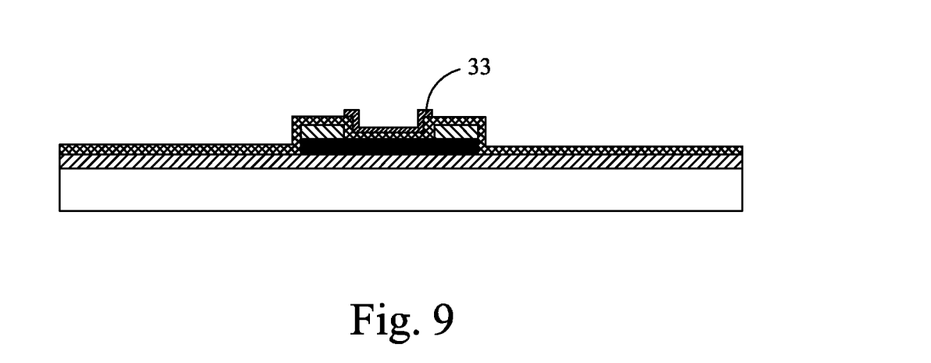
FIG. 9 is a schematic view showing the structure where a gate terminal has been formed on the substrate of the present invention.

Step 5: sequentially depositing an insulation layer 31 and a second metal layer 32 on the substrate and patterning the second metal layer 32 to form a gate terminal 33.

In the instant embodiment, the insulation layer 31 is preferably formed by deposition of silicon dioxide.

Referring to FIGS. 8 and 9, in the step, the second metal layer 32 is subjected to processes of exposing, developing, etching, and photoresist peeling to form the gate terminal 33. The exposure operation of the second metal layer 32 used in the step is a regular exposure operation, which is easy to operate and is convenient and efficient, making it favorable for increasing the throughput. In the step, the etching operation applied to the second metal layer 32 is a wet etch process. In this step, the second masking operation of the three masking operations of the present invention is performed.

Figure 10:
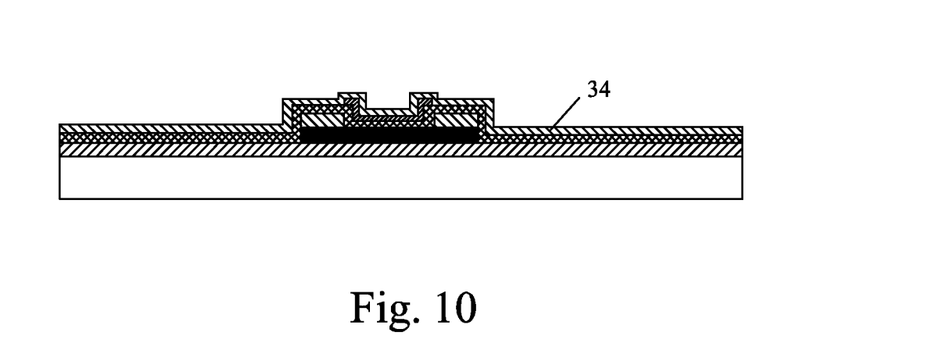
FIG. 10 is a schematic view showing the structure where a protective layer has been formed on the substrate of the present invention.
Figure 11:
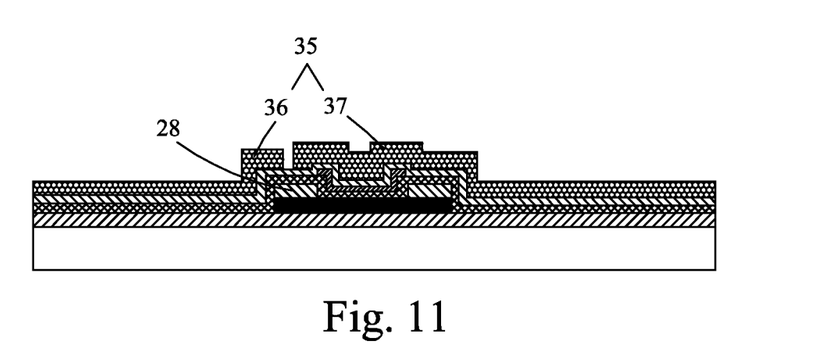
FIG. 11 is a schematic view showing the structure where a second photoresist has been formed on the substrate of the present invention.

Step 6: depositing a protective layer 34 on the substrate, forming a second photoresist layer on the protective layer 34, and patterning the second photoresist layer to form, at a predetermined location, a second photoresist pattern 35, which comprises a third portion 36 that is located at one side of the drain terminal 28 and on a portion of the drain terminal 28 and a fourth portion 37 that is located at an opposite side of the drain terminal 28 and on a portion of the drain terminal 28, wherein the third portion 36 and the fourth portion 37 of the second photoresist pattern 35 define therebetween a recess, as shown in FIGS. 10 and 11.

In the instant embodiment, the protective layer 34 is formed by deposition of silicon dioxide or silicon nitride (SiN$_x$). The second photoresist pattern 35 is formed by being subjected to grey level, masking, exposing, developing and the third portion 36 of the second photoresist pattern 35 is formed by means of grey level exposure. The second photoresist pattern 35 forms a recess opposite to the drain terminal 28 and the recess is used to carry out etching to form a contact hole 41. In the step, the third masking operation of the three masking operations of the present invention is performed.

Figure 12:
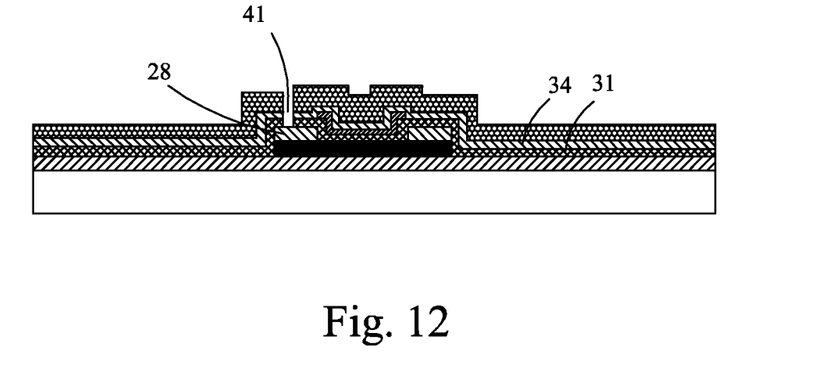
FIG. 12 is a schematic view showing the structure where a contact hole formed in the substrate of the present invention.
Figure 13:
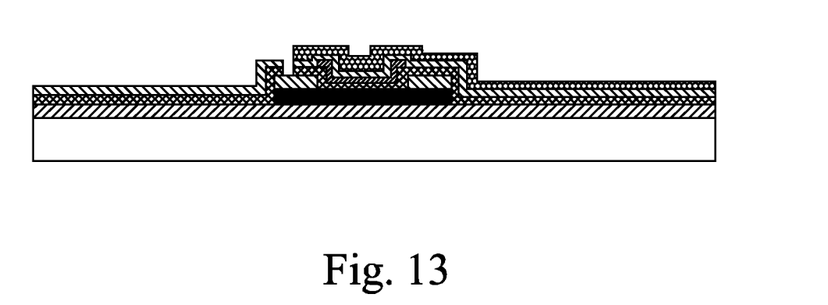
FIG. 13 is a schematic view showing the structure where a second photoresist layer of a second grey level exposure zone of the substrate of the present invention has been ashed.

Step 7: etching off a part of the protective layer 34 that is not covered by the second photoresist pattern 35 and a part of the insulation layer 31 corresponding to the part of the protective layer 34 in order to expose the drain terminal 28, thereby forming a contact hole 41, and removing the third portion 36 of the second photoresist pattern 35, as shown in FIGS. 12 and 13.

In this step, a dry etch process is used to etch off the part of the protective layer 34 that is not covered by the second photoresist pattern 35 and the part of the insulation layer 31 corresponding to the part of the protective layer 34 so as to form the contact hole 41. The contact hole 41 is located between the third portion 36 and the fourth portion 37 of the second photoresist pattern 35 for connection with the drain terminal of the TFT.

Figure 14:
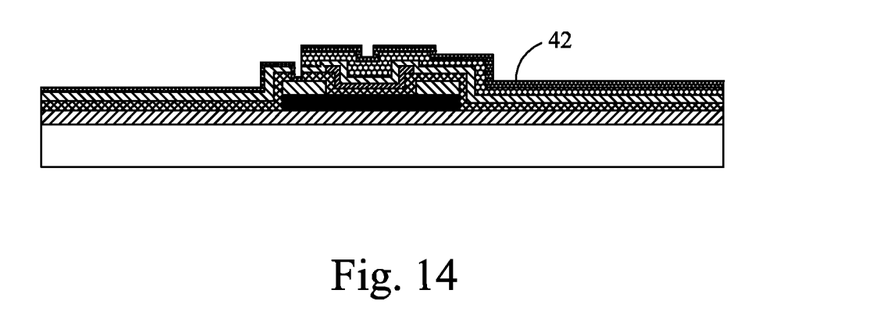
FIG. 14 is a schematic view showing the structure where a transparent conductive layer is formed on the substrate of the present invention.
Figure 15:
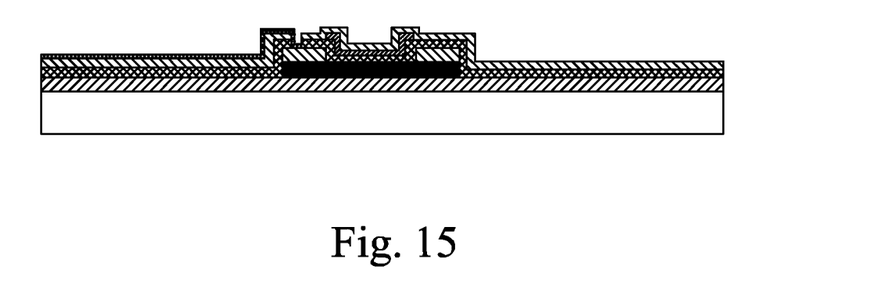
FIG. 15 is a schematic view showing the structure where the second photoresist layer of the second regular exposure zone and the transparent conductive layer on the portion of the second photoresist layer of the substrate of the present invention have been peeled off.

Step 8: depositing a transparent conductive layer 42 on the substrate and peeling and removing the fourth portion 37 of the second photoresist pattern 35 and the transparent conductive layer 42 located thereon through photoresist peeling, as shown in FIGS. 14 and 15.

The transparent conductive layer 42 is coupled to the drain terminal of the TFT to serve as an electrode for a storage capacitor of the array substrate.

Step 9: subjecting the substrate to an annealing treatment to thus complete the manufacture of the TFT array substrate.

It is noted that, besides being applicable to the manufacture of an array substrate of a TFT LCD, the technical solution of the present invention is also applicable to other fields related to depositions of optic films and electronic films.

In summary, the present invention provides a method for manufacturing a thin-film transistor, wherein a TFT array substrate adopts a top-gate structure. The method for manufacturing a thin-film transistor applies three times of masking operation in manufacturing of the TFT array substrate, wherein IGZO is used to form a TFT of the TFT array substrate so as to greatly increase the charging speed of the TFT with respect to a pixel electrode, improve the response speed of the pixel, and achieve a relatively high refresh rate. Further, the fast response also help improving row scanning rate of pixels to make it possible to achieve ultra-high definition of a TFT LCD. Further, the manufacturing method applies only three times of masking operation so as to significantly reduce the manufacturing steps, shortening the manufacturing time, effectively lowering down the manufacturing cost, and increasing throughput.

Based on the description given above, those having ordinary skills of the art may easily contemplate various changes and modifications of the technical solution and technical ideas of the present invention and all these changes and modifications are considered within the protection scope of right for the present invention.

What is claimed is:

1. A b method for manufacturing a thin-film transistor (TFT) array substrate, wherein the TFT array substrate is of a top-gate structure, the method for manufacturing a thin-film transistor comprising the following steps:
   (1) providing a substrate;
   (2) sequentially depositing and forming a buffer layer, an oxide semiconductor film, and a first metal layer on the substrate;
   (3) forming a first photoresist layer on the first metal layer and patterning the first photoresist layer to form, at a predetermined location, a first photoresist pattern, which comprises a first portion and a second portion defining a ditch zone corresponding to the oxide semiconductor film, wherein the first photoresist pattern has a thickness in the second portion that is greater than that of the first portion;
   (4) etching off parts of the first metal layer and the oxide semiconductor film that are located in areas not covered by the first photoresist pattern, removing the first portion of the first photoresist pattern to expose the first metal layer, etching off the first metal layer by using the second portion of the first photoresist pattern as a mask in order to expose the oxide semiconductor film, and peeling off the first photoresist pattern in order to form a source terminal and a drain terminal on the first metal layer;
   (5) sequentially depositing an insulation layer and a second metal layer on the substrate and patterning the second metal layer to form a gate terminal;
   (6) depositing a protective layer on the substrate, forming a second photoresist layer on the protective layer, and patterning the second photoresist layer to form, at a predetermined location, a second photoresist pattern, which comprises a third portion that is located at one side of the drain terminal and on a portion of the drain terminal and a fourth portion that is located at an opposite side of the drain terminal and on a portion of the drain terminal, wherein the third portion and the fourth portion of the second photoresist pattern define therebetween a recess;
   (7) etching off a part of the protective layer that is not covered by the second photoresist pattern and a part of the insulation layer corresponding to the part of the protective layer in order to expose the drain terminal, thereby forming a contact hole, and removing the third portion of the second photoresist pattern; and
   (8) depositing a transparent conductive layer on the substrate and peeling and removing the fourth portion of the second photoresist pattern and the transparent conductive layer located thereon through photoresist peeling.

2. The method for manufacturing a TFT array substrate as claimed in claim 1 further comprising a step (9) after step (8) for subjecting the substrate to an annealing treatment to thus complete the manufacture of the TFT array substrate.

3. The method for manufacturing a TFT array substrate as claimed in claim 1, wherein the substrate comprises a glass substrate; the buffer layer is formed of deposition of silicon dioxide; and the oxide semiconductor film comprises an indium gallium zinc oxide (IGZO) film.

4. The method for manufacturing a TFT array substrate as claimed in claim 1, wherein in step (3), the first photoresist pattern is formed by being subjected operations of grey level, masking, exposing, and developing.

5. The method for manufacturing a TFT array substrate as claimed in claim 1, wherein in step (4), a dry etch process is used to etch off the first metal layer with the second portion of the first photoresist pattern as a mask; and in step (4), peeling off the first photoresist pattern comprises an operation of peeling off the second portion of the first photoresist pattern.

6. The method for manufacturing a TFT array substrate as claimed in claim 1, wherein in step (6), the protective layer is formed by deposition of silicon dioxide or silicon nitride; and the second photoresist pattern is formed by being subjected to grey level, masking, exposing, developing.

7. The method for manufacturing a TFT array substrate as claimed in claim 1, wherein in step (7), a dry etch process is used to etch off the part of the protective layer that is not covered by the second photoresist pattern and the part of the insulation layer corresponding to the part of the protective layer so as to form the contact hole.

8. The method for manufacturing a TFT array substrate as claimed in claim 1, wherein in step (5), the insulation layer is formed by deposition of silicon dioxide; and in step (5), the second metal layer is subjected to operations of exposing, developing, etching, and photoresist peeling to form the gate terminal.

9. The method for manufacturing a TFT array substrate as claimed in claim 8, wherein the etching comprises a wet etch process.

10. A method for manufacturing a thin-film transistor (TFT) array substrate, wherein the TFT array substrate is of a top-gate structure, the method for manufacturing a thin-film transistor comprising the following steps:

(1) providing a substrate;
(2) sequentially depositing and forming a buffer layer, an oxide semiconductor film, and a first metal layer on the substrate;
(3) forming a first photoresist layer on the first metal layer and patterning the first photoresist layer to form, at a predetermined location, a first photoresist pattern, which comprises a first portion and a second portion defining a ditch zone corresponding to the oxide semiconductor film, wherein the first photoresist pattern has a thickness in the second portion that is greater than that of the first portion;
(4) etching off parts of the first metal layer and the oxide semiconductor film that are located in areas not covered by the first photoresist pattern, removing the first portion of the first photoresist pattern to expose the first metal layer, etching off the first metal layer by using the second portion of the first photoresist pattern as a mask in order to expose the oxide semiconductor film, and peeling off the first photoresist pattern in order to form a source terminal and a drain terminal on the first metal layer; and
(5) sequentially depositing an insulation layer and a second metal layer on the substrate and patterning the second metal layer to form a gate terminal;
and further comprising:
a step (6) after step (5) for depositing a protective layer on the substrate, forming a second photoresist layer on the protective layer, and patterning the second photoresist layer to form, at a predetermined location, a second photoresist pattern, which comprises a third portion that is located at one side of the drain terminal and on a portion of the drain terminal and a fourth portion that is located at an opposite side of the drain terminal and on a portion of the drain terminal, wherein the third portion and the fourth portion of the second photoresist pattern define therebetween a recess;
a step (7) after step (6) for etching off a part of the protective layer that is not covered by the second photoresist pattern and a part of the insulation layer corresponding to the part of the protective layer in order to expose the drain terminal, thereby forming a contact hole, and removing the third portion of the second photoresist pattern; and
a step (8) after step (7) for depositing a transparent conductive layer on the substrate and peeling and removing the fourth portion of the second photoresist pattern and the transparent conductive layer located thereon through photoresist peeling;
and further comprising a step (9) after step (8) for subjecting the substrate to an annealing treatment to thus complete the manufacture of the TFT array substrate;
wherein the substrate comprises a glass substrate; the buffer layer is formed of deposition of silicon dioxide; and the oxide semiconductor film comprises an indium gallium zinc oxide (IGZO) film;
wherein in step (3), the first photoresist pattern is formed by being subjected operations of grey level, masking, exposing, and developing; and
wherein in step (4), a dry etch process is used to etch off the first metal layer with the second portion of the first photoresist pattern as a mask; and in step (4), peeling off the first photoresist pattern comprises an operation of peeling off the second portion of the first photoresist pattern.

11. The method for manufacturing a TFT array substrate as claimed in claim 10, wherein in step (6), the protective layer is formed by deposition of silicon dioxide or silicon nitride; and the second photoresist pattern is formed by being subjected to grey level, masking, exposing, developing.

12. The method for manufacturing a TFT array substrate as claimed in claim 10, wherein in step (7), a dry etch process is used to etch off the part of the protective layer that is not covered by the second photoresist pattern and the part of the insulation layer corresponding to the part of the protective layer so as to form the contact hole.

13. The method for manufacturing a TFT array substrate as claimed in claim 10, wherein in step (5), the insulation layer is formed by deposition of silicon dioxide; and in step (5), the second metal layer is subjected to operations of exposing, developing, etching, and photoresist peeling to form the gate terminal.

14. The method for manufacturing a TFT array substrate as claimed in claim 13, wherein the etching comprises a wet etch process.

* * * * *